(12) United States Patent
Boehm et al.

(10) Patent No.: US 6,518,908 B2
(45) Date of Patent: Feb. 11, 2003

(54) METHOD AND DEVICE FOR ANALOG-TO-DIGITAL CONVERSION OF A SIGNAL

(75) Inventors: Konrad Boehm, Blaustein (DE); Johann-Friedrich Luy, Ulm (DE); Thomas Mueller, Ulm (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/798,025

(22) Filed: Feb. 22, 2001

(65) Prior Publication Data

US 2001/0043154 A1 Nov. 22, 2001

(30) Foreign Application Priority Data

Feb. 24, 2000 (DE) .......................... 100 08 699

(51) Int. Cl.[7] .................. H03M 1/12; H03M 7/00
(52) U.S. Cl. .................. 341/155; 341/152; 341/50; 382/250
(58) Field of Search .................. 341/50, 155, 152; 382/250, 251, 248

(56) References Cited

U.S. PATENT DOCUMENTS

| | | | | |
|---|---|---|---|---|
| 3,605,019 A | * | 9/1971 | Cutter | 370/210 |
| 4,456,982 A | * | 6/1984 | Tournois | 367/11 |
| 5,323,391 A | * | 6/1994 | Harrison | 370/70 |
| 5,568,142 A | | 10/1996 | Velasquez et al. | 341/126 |
| 5,956,686 A | * | 9/1999 | Takashima et al. | 704/500 |
| 6,016,356 A | * | 1/2000 | Ito et al. | 382/132 |
| 6,249,749 B1 | * | 6/2001 | Tran et al. | 702/66 |
| 6,324,268 B1 | * | 11/2001 | Balachandran et al. | 379/93.08 |

OTHER PUBLICATIONS

Walden, Robert H., "Performance Trends for Analog-to-Digital Converters", IEEE Communications, Feb. 1999, vol. 37, No. 2, pp. 96–101.

* cited by examiner

*Primary Examiner*—Peggy JeanPierre
(74) *Attorney, Agent, or Firm*—Davidson, Davidson & Kappel, LLC

(57) ABSTRACT

A method for analog-to-digital conversion of an analog signal includes decomposing the signal in the time domain into intervals, and transforming these intervals one after another using orthogonal functions, the coefficients corresponding to the orthogonal functions being defined and digitized. The transformed signal is then inversely transformed in the digital domain using the digitized coefficients and the same or different orthogonal functions. A high level of performance with respect to bandwidth and resolution may be achieved.

13 Claims, 7 Drawing Sheets

METHOD AND DEVICE FOR ANALOG-TO-DIGITAL CONVERSION OF A SIGNAL

FIELD OF THE INVENTION

The present invention relates to a method and a device for analog-to-digital conversion of a signal.

RELATED TECHNOLOGY

Analog-to-digital conversion, referred to in the following as A/D conversion, devices or circuitry are used for digital signal processing, e.g., in television, radio or receiver technology, as so-called A/D converters for video and audio signals. In this context, analog signals are converted into digital signals for processing. U.S. Pat. No. 5,568,142, for example, purports to describe a method for analog-to-digital conversion of a band-limited signal, where, on the basis of filters, the signal is partitioned into various signals which, once digitized, are recombined by filters.

The constant rise in memory chip capacity and the increasing power of high-speed processors have resulted in improved performance of digital signal processing. With respect to resolution and bandwidth, the performance of A/D converters is improving at a substantially slower rate than that of comparable components used in digital signal processing. The performance of A/D converters is limited by a constant product of resolution and bandwidth (see R. H. Walden, "Performance Trends for ADC", IEEE Communication Magazine, February 1999, pp. 96–101). Therefore, to enhance performance, in particular to achieve a highest possible bandwidth, a plurality of conventional A/D converters having time interleaved sampling instants is employed. The disadvantage here is that offset and gain errors resulting from the parallel configuration of the A/D converters cause jump discontinuities to occur at the sampling instants. These jump discontinuities are characterized by discrete disturbance lines, or lines of perturbation, in the useful signal spectrum.

SUMMARY OF THE INVENTION

An object of the present invention is, therefore, to provide a method and a device for the analog-to-digital conversion of an analog signal, which will render possible high performance with respect to bandwidth and resolution.

The present invention provides a method for the analog-to-digital conversion of a band-limited signal (x(t)), wherein the signal (x(t)) is transformed on the basis of orthogonal functions ($g_j(t)$), coefficients ($a_j$) corresponding to the orthogonal functions ($g_j(t)$) and the signal x(t) being defined and digitized, and, on the basis of the digitized coefficients ($a_j^d$), the signal ($x^d(t)$) being inversely transformed in the digital domain by orthogonal functions ($h_j(t)$).

In this context, instead of sequentially digitizing individual sampled values of a conventional A/D converter, the method according to the present invention processes one complete interval of the signal's time function. To this end, the signal that is time-limited to the interval is described on the basis of orthogonal functions. The signal is preferably decomposed into several intervals. By limiting the time function of the signal to the interval, with subsequent transformation with the assistance of orthogonal functions, the signal is substantially fully defined in the digital domain on the basis of discrete coefficients of the orthogonal functions in equidistant or non-equidistant spacing, and can be reconstructed from these coefficients. In other words: on the basis of orthogonal functions, the signal is processed into an equation for its transforms, which is then digitized and inversely transformed into the original domain, with the result that the original function of the signal is defined in the digital domain.

The signal is expediently limited in the time domain to the interval and, within the interval, represented by a sum of orthogonal functions having a predefinable number of summands, or addends, the coefficients corresponding to the orthogonal functions being defined for the interval and digitized, and, through inverse transformation of the digitized coefficients on the basis of orthogonal functions, the signal being represented in the digital domain. The signal is preferably decomposed into several intervals, enabling it to be represented over a large time domain. In band-limiting the signal, it is useful to consider the sampling, or Nyquist, theorems. According to the sampling theorems, when limiting the time or frequency function, discrete values of the frequency function or of the time function suffice for providing a complete description of the signal. The time function of the signal is preferably represented by the development of orthogonal functions in accordance with a complete system. This means that the band-limited signal is fully described by a finite summation. For example, the signal in the analog domain is represented on the basis of the generalized Fourier analysis:

$$x(t) = \sum_j^N a_j \cdot g_j(t) = \sum_j^N (x(t), g_j(t)) \cdot g_j(t), \quad (1)$$

$$a_j = (x(t), g_j(t)) = \int_0^T x(t) \cdot g_j(t) dt \quad (2)$$

where x(t)=time function of the signal, $g_j(t)$=orthogonal functions, $a_j$=coefficients, N=number of summands=number of orthogonal functions=number of interpolation nodes in the transformed domain (frequency domain for the special case of the Fourier transform)=number of parallel channels, T=length of the interval in the time domain.

Equation (2) defines the so-called inner product between x(t) and $g_j(t)$. For the sake of brevity, the symbolic notation (x(t), $g_j(t)$) is used in the following text. The closeness of the approximation is determined by the number of summands, which, in a real system, are truncated following a finite number. In this context, the minimal value for the number N of summands, also referred to as interpolation nodes, is derived from the sampling theorems in the time and frequency domain for time-limited and band-limited signals. The number of summands N is preferably determined by the equation:

$$N = \frac{T}{\tau} \quad (3)$$

where T=the length of the interval in the time domain, τ=the segment in the time domain, where $$\tau = \frac{1}{2B} \quad \text{(Nyquist criterion)} \quad (4)$$

and B=bandwidth.

In this context, the number of summands is preferably selected such that adequate resolution is assured. Preferably, one selects the same systems of orthogonal functions in the analog domain (transform) and in the digital domain (inverse transform). Alternatively, the systems of orthogonal functions, also referred to as basic functions, may also be different.

The digitized coefficients are expediently inversely transformed in such a way that, in the digital domain, the signal is described by multiplying the digitized coefficients by predefinable orthogonal functions, and through subsequent summation. In the case that the basic functions differ in the analog and in the digital domain, then the coefficients are combined by a linear transform, as expressed by:

$$x(t) = \sum_j^N a_j \cdot g_j(t) = \sum_j^N b_j^d \cdot h_j(t), \tag{5}$$

provided that $g_j(t) \neq h_j(t)$,
  respectively $$x(t) = \sum_j^N a_j \cdot g_j(t) = \sum_j^N a_j^d \cdot h_j(t), \tag{6}$$

provided that $g_j(t) = h_j(t)$,
  where $x(t)$=time function of the signal, $g_j(t)$=orthogonal functions in the analog domain, $a_j$=coefficients in the analog domain, $h_j(t)$=orthogonal functions in the digital domain, $a_j^d$, $b_j^d$=coefficients in the digital domain, N=number of summands.

Depending on the requirements and criteria for the digital signal processing, trigonometric functions, Walsh functions, and/or complex exponential functions are used as orthogonal functions. In the analog domain, trigonometric functions, e.g., sine functions and/or cosine functions, are preferably used. In the digital domain, functions, such as Walsh or Haar functions, which can only assume the values +1 or −1, may be employed.

In an orthonormal system, it holds for the inner product of orthogonal functions that:

$$(g_j, g_i) = \begin{cases} 0, & \text{when } j \neq i \\ 1, & \text{when } j = i; \end{cases} \qquad (h_j, h_i) = \begin{cases} 0, & \text{when } j \neq i \\ 1, & \text{when } j = i; \end{cases}$$

To determine coefficients $b_j$ in equation (5), the scalar product (inner product) is formed.

$$\sum_j (x, g_j)g_j = \sum_j (x, h_j)h_j \quad | h_i \text{ formation of the inner product} \tag{7}$$

$$\sum_j (x, g_j)(g_j, h_i) = (x, h_i) \tag{8}$$

$$\sum_j a_j(g_j, h_i) = b_i \tag{9}$$

In this context, the coefficients in the digital domain are preferably determined on the basis of a transformation matrix having matrix elements $(g_j, h_i) = m_{j,i}$ as expressed by:

$$\begin{pmatrix} \vdots \\ b_i \\ \vdots \end{pmatrix} = \begin{pmatrix} \cdots & \cdots \\ \vdots & \vdots \\ \cdots & (g_j, h_i) \end{pmatrix} (\cdots a_j \cdots) \tag{10}$$

In an embodiment according to the present invention, in place of the above described decomposition (representation) of the signal function according to a system of classical orthogonal functions (generalized Fourier transform), a decomposition (representation) is undertaken through a wavelet transformation.

The wavelet transformation for the analog signal $x(t)$ is defined as follows:

$$L_\psi x(a, b) = \frac{1}{\sqrt{|a|}} \cdot \int_{-\infty}^{\infty} x(t) \cdot \psi\left(\frac{t-b}{a}\right) dt \tag{11}$$

where $L_\psi x(a,b)$=wavelet transformation of the signal with two variables, a=extension on the time axis, b=shift on the time axis, $x(t)$=time function of the signal, $\Psi(t-b/a)$=vavelet function.

The inverse transformation of the signal is preferably defined as follows:

$$x(t) = c \cdot \int_{-\infty}^{\infty} \int_{-\infty}^{\infty} L_\psi x(a, b) \cdot \Psi_{a,b}(t) \cdot \frac{1}{a^2} \, da \, db \tag{12}$$

where $L_\psi x(a,b)$=wavelet transformation of the signal with two variables, a=extension on the time axis, b=shift on the time axis, $x(t)$=time function of the signal, $\Psi(t)$=wavelet function, c=constant.

The double integral is realized redundantly. A double sum may also be alternatively employed.

It appears to be especially advantageous for the application intended here to use the Haar-Wavelet function, as expressed by:

$$\Psi(t) = \begin{cases} 1 & \text{for } 0 \leq t \leq 1/2 \\ -1 & \text{for } 1/2 \leq t \leq 1 \\ 0 & \text{otherwise.} \end{cases} \tag{13}$$

Thus, the wavelet transformation is derived as expressed by equation (11):

$$L_\psi x(a, b) = \frac{1}{\sqrt{|a|}} \cdot \left( \int_b^{b+\frac{a}{2}} x(t)dt - \int_{b+\frac{a}{2}}^{b+a} x(t)dt \right) \tag{14}$$

Another preferred embodiment of the wavelet transformation is the dyadic wavelet transformation, in which wavelet functions are used as basic functions, as expressed by the following relation:

$$\Psi_{i,j}(t) = \frac{1}{\sqrt{2^i}} \cdot \Psi\left(\frac{t - 2^i \cdot j}{2^i}\right) \tag{15}$$

The various basis functions for the dyadic wavelet transformation are derived from a wavelet function by doubling or halving the width and by shifting the width by integral multiples. The time intervals and, respectively, instants a, b for the wavelet functions are advantageously generated through frequency division, i.e., deceleration of a fast basic clock rate. This can be accomplished, for example, by shift registers.

The present invention also provides a device for analog-to-digital conversion of an analog signal having an input model for transforming the signal in the analog domain using orthogonal functions, a module for digitizing coefficients of the transformation function, as well as an output module for inversely transforming the signal in the digital domain. The input module is effectively used to represent the signal within the interval by a sum of orthogonal functions having a predefinable number of summands. The entire signal is expediently decomposed into a plurality of intervals. The coefficients are preferably defined for the interval by the input module.

After forming the inner products (also referred to as scalar products), i.e., after determining the coefficients within the interval that correspond to the orthogonal functions, the N coefficients are digitized in N modules, in particular in N conventional A/D converters. By multiplying the coefficients determined in the process by the orthogonal functions using the output module, the signal is completely representable in the digital domain.

In one embodiment according to the present invention, the input module contains a number of correlators equivalent to the number of summands, each correlator encompassing one multiplier and integrator. In this context, the multiplier in question is used to multiply the time function of the signal by the corresponding orthogonal function. Expediently provided as an integrator is a low-pass filter. The combination, in terms of circuit engineering, of the multiplier and low-pass filter enables coefficients $a_j$ of the orthogonal function to be determined in the analog domain.

The input module optionally contains, by preference, a number of matched filters equivalent to the number of summands. Each so-called matched filter, also referred to as signal-adapted filter or correlation filter, preferably encompasses a filter having an impulse response representing the particular orthogonal function, and a sampler. Thus, in terms of circuit engineering, an especially simple design of the signal-transformation device is provided.

Once the inner products are formed, with the result that the coefficients of the orthogonal functions are determined in the analog domain, the coefficients are digitized by the conventional A/D converter. The number of correlators, i.e., of correlation filters (matched filters) is preferably equivalent to the number of A/D converters. In the digital domain, the output module usefully contains a number of multipliers equivalent to the number of summands, as well as a summation element.

The multiplier is used to multiply the coefficient in question by the orthogonal function in the digital domain. Subsequent summation of all parallel branches, or subtrees, makes the signal completely representable in the digital domain. The number of branches or channels is equivalent in this context to the number of summands. Each branch includes, on the input side, the correlator or correlation filter for transformation, the corresponding A/D converter for digitization, and, on the output side, the multiplier for inverse transformation. A device featuring this kind of circuit-engineering design and used for analog-to-digital signal conversion is also characterized as a correlation analog-to-digital converter.

An embodiment of the device according to the present invention uses dyadic Haar wavelets as orthogonal functions. Each input module includes two parallel-connected switches, each having an assigned low-pass filter. In this context, the two switches of each branch are used to form the integral over signal x(t), with the limits of integration conforming to the selected wavelet function. Each branch represents a different wavelet function, or basic function, the various wavelet functions being generated from a logic function (see equation (13)) by doubling or halving the width and by shifting the width by integral multiples. These operations are performed by the switches. To this end, the opening and closing instants for the switches are selected to achieve an integration in conformance with equation (14).

The coefficients of the wavelet transformation are preferably digitized for each branch by the corresponding module, in particular by a conventional A/D converter. To normalize the discrete coefficients as a function of the corresponding wavelet function, a matching element, or adaptor, is expediently provided for each branch. The normalization is preferably carried out in the digital domain. For the inverse transformation, the output module advantageously contains a number of matching elements and multipliers equivalent to the number of branches. Subsequent summation of all branches makes the signal thoroughly representable in the digital domain. This means that, in the case of the dyadic Haar wavelet transformation, each branch includes, on the input side, the two switches, each having a corresponding low-pass filter, for the transformation, the corresponding A/D converter for the digitization, and, on the output side, the matching element and the multiplier for the inverse transformation.

It is beneficial for a receiver to include one of the above described devices for the analog-to-digital conversion of a signal. This makes the receiver particularly suited for digital audio broadcasting, where high-speed signal processing with an especially high sampling rate is required.

According to the present invention, a combined time-domain and frequency-domain analysis is performed on the signal. By considering the signal in a time interval, as well as by describing it on the basis of orthogonal functions within the interval, the signal is completely described, both in the analog as well as in the digital domain, which, in contrast to sampling operations using conventional A/D converters (time-interleaving A/D converters), makes it possible to reliably avoid offset and gain errors and resultant discrete disturbance, or perturbation, lines. In comparison to a single, conventional A/D converter having a high sampling rate, the multiplicity of parallel-connected A/D converters, with the number of parallel branches being equivalent to the number of predefinable summands, means that the sampling rate of the single A/D converter of the device should be selected to be lower by the factor of the number of summands.

BRIEF DESCRIPTION OF THE DRAWINGS

The present invention is elaborated upon below with reference to the drawings, in which.

Equivalent parts are denoted by the same reference numerals in the figures.

DETAILED DESCRIPTION

Figure 1:
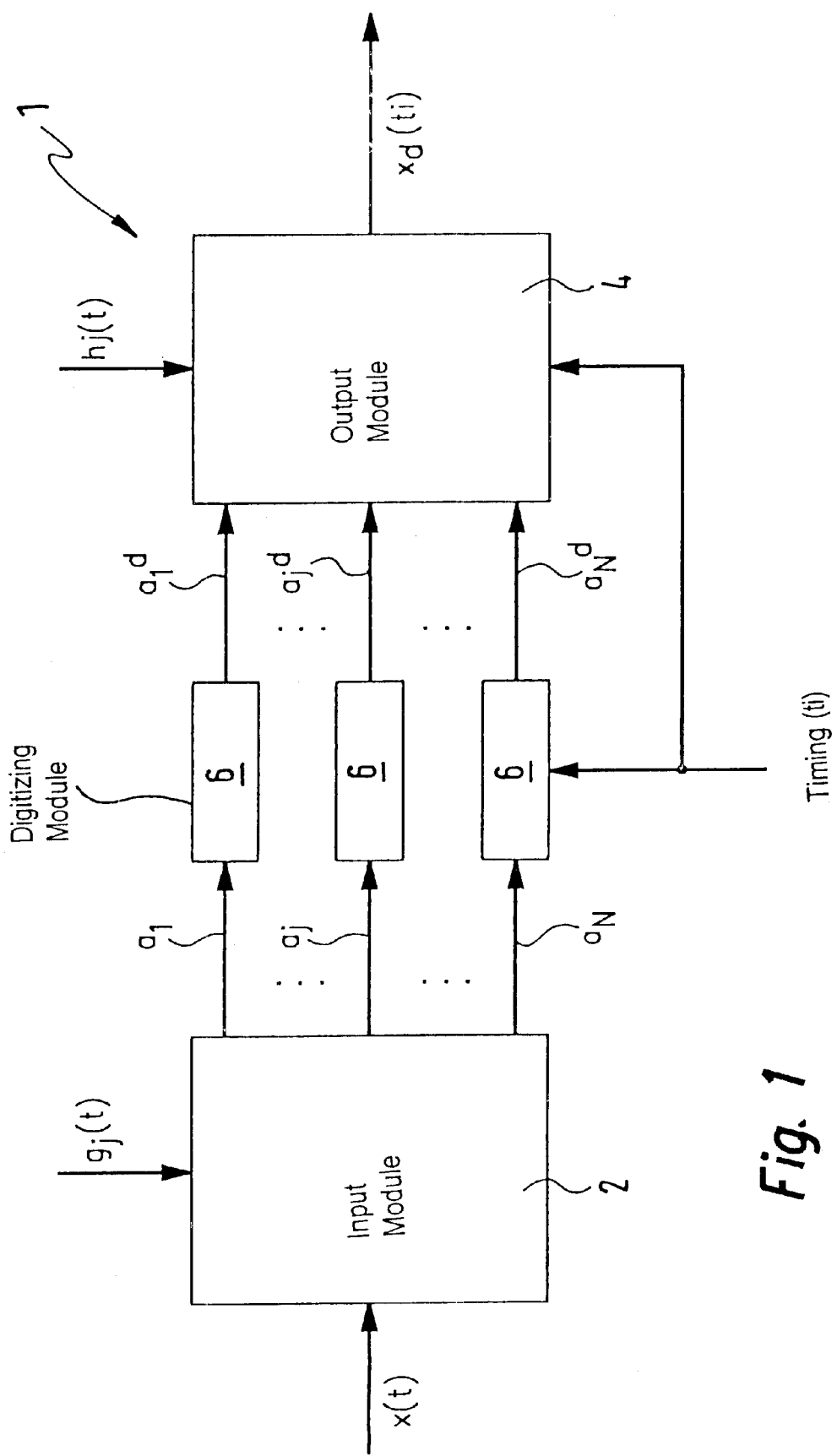
FIG. 1 shows a schematic block diagram of a device for analog-to-digital conversion of a signal, the device including an input module, a digitizing module, and an output module.

FIG. 1 schematically illustrates a device 1 for the analog-to-digital conversion of an analog, band-limited, i.e., having a finite, upper frequency limit, signal x(t), including an input module 2 for transformation of signal x(t), and an output module 4 for inverse transformation of signal x(t), a number of modules 6 being provided between input module 2 and output module 4 for digitizing corresponding coefficients $a_j$ of the transformation.

During operation of device 1, signal x(t) supplied to input module 2 is decomposed, or partitioned, into a plurality of intervals of duration T. Band-limited signal x(t) is completely described within one single interval T by a finite summation of orthogonal functions $g_j(t)$. In this context, the number N of summands is predefinable. The number of summands, i.e., of interpolation nodes, corresponds to the number of time segments into which one time interval T is partitioned. The minimal value for the number N of summands is derived in the process from the sampling, or Nyquist, theorems in the time and frequency domain, as expressed by equations (3) and (4).

In dependence upon the number N of summands, orthogonal functions $g_j(t)$ (where $1 \leq j \leq N$) are supplied to input module 2. Signal x(t) is transformed on the basis of orthogonal functions $g_j(t)$. For example, signal x(t) in the analog domain is represented on the basis of the generalized Fourier analysis, as expressed by equation (1). With the assistance of input module 2, coefficients $a_j$, corresponding to orthogonal functions $g_j(t)$, of summand j in question are defined in accordance with equation (2).

To digitize the values of coefficients $a_j$, provision is made for the number of parallel-connected modules 6 to be equivalent to the number N of summands j. On the basis of the digitized values of coefficients $a_j^d$ in the digital domain, signal $x^d(t_i)$ in the digital domain is represented on the basis of the inverse transformation by orthogonal functions $h_j(t)$. The result of the inverse transformation is digitized signal $x^d(t_i)$ at instant $t_i=i$ T; i=1,2,3, . . .

Figure 2:
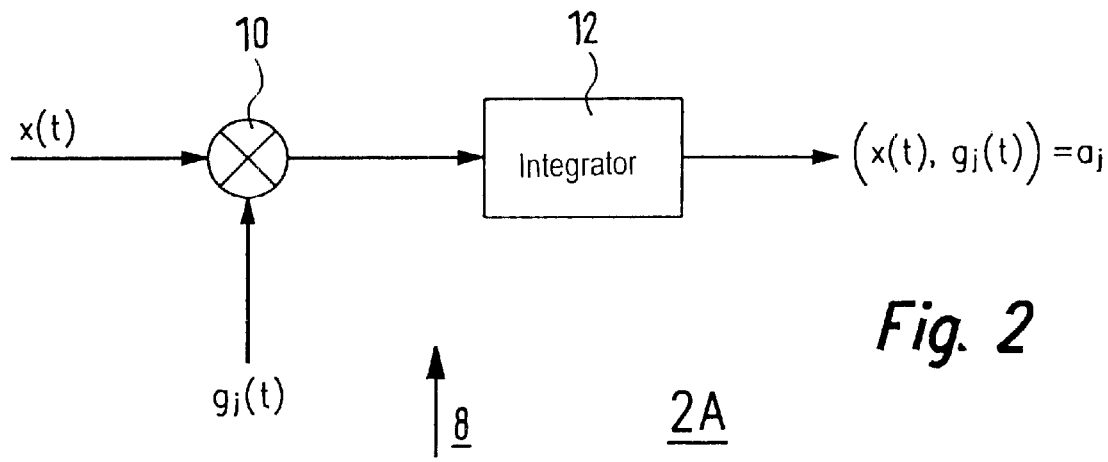
FIG. 2 shows a schematic block diagram of an embodiment of an input module.

FIG. 2 shows an embodiment, in terms of circuit engineering, of an input module 2A formed by a correlator 8. In this context, correlator 8 encompasses a multiplier 10 for multiplying signal x(t) by the predefined orthogonal function $g_j(t)$, and an integrator 12, for example a low-pass filter. Coefficients $a_j$ of the transformation are determined by the circuitry combination of multiplier 10 and integrator 12. Depending on the specific embodiment of device 1, for each summand j, this device can have its own input module 2A or, alternatively, a shared input module 2A having N parallel-connected correlators 8.

Figure 3:
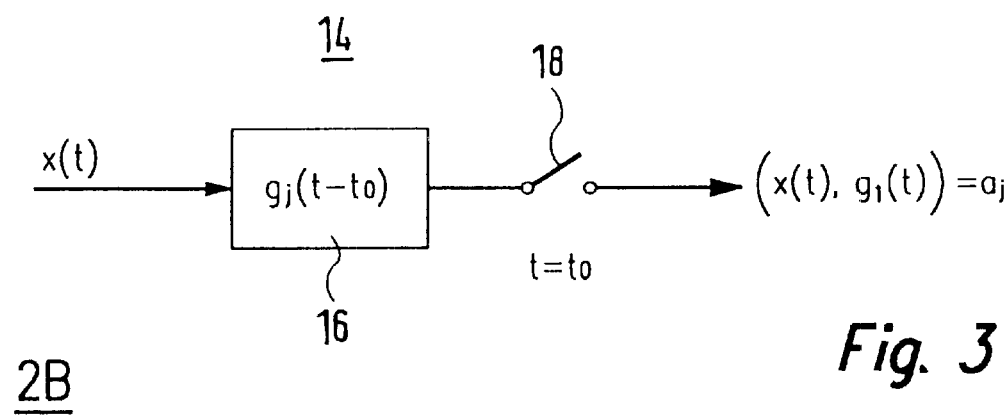
FIG. 3 shows a schematic block diagram of another embodiment of an input module.

An alternative embodiment of an input model 2B is illustrated in FIG. 3. In terms of circuit engineering, a matched filter 14 (signal-adapted filter) is used as an input model 2B, which includes a filter 16 having an impulse response representing the particular orthogonal function $g_j(t)$, and a sampler 18. In this context, the number of input modules 2B, i.e., of matched filters 14, is equivalent to the number N of summands.

Figure 4:
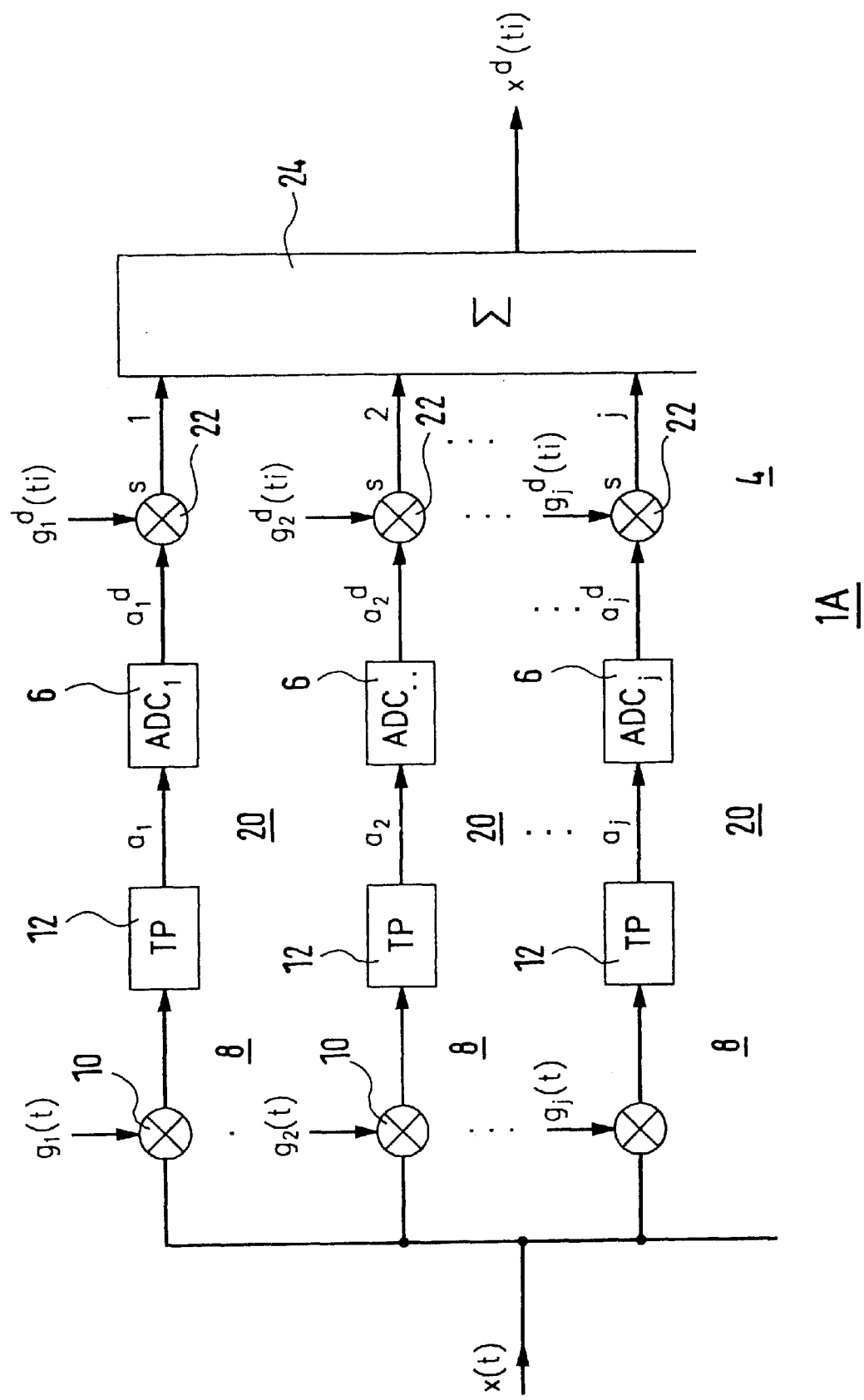
FIG. 4 shows a schematic block diagram of a device in accordance with FIG. 1, including an input module in accordance with FIG. 2.

FIG. 4 depicts the circuitry design of device 1A having a plurality of branches 20, including, in each case, correlator 8 of input module 2A for the transformation, module 6 for the digitization, and output module 4 for the inverse transformation. Branches 20 are configured in parallel to one another. The number of branches 20 corresponds to the number N of summands j and, thus, to the number of orthogonal functions $g_j(t)$. Analog signal x(t) is fed to each branch 20.

In each branch 20, the assigned multiplier 10 of correlator 8 multiplies the assigned basic function (orthogonal) function $g_j(t)$ by signal x(t). As orthogonal functions $g_j(t)$ in the analog domain, trigonometric functions, such as sine, cosine functions, and/or complex exponential functions may be used. Three branches 20 of the N branches are shown by way of example in FIG. 4. In a branch 20, for example for N=8, the following basic functions are employed as orthogonal functions $g_j(t)$: $g_1(t)$=sin ωt, $g_2(t)$=sin 2ωt, $g_3(t)$=sin 3ωt to $g_4(t)$=sin 4ωt, $g_5(t)$=cos 0ωt, $g_6(t)$=cos ωt, $g_7(t)$=cos 2ωt, $g_8(t)$=cos 3ωt (where $1 \leq j \leq N$, N=number of summands).

Integrator 12, e.g., in terms of circuit engineering, a low-pass filter (LP), connected downstream from multiplier 10, is used to determine the corresponding coefficients $a_1$ through $a_N$ of the transformation in branches 20. With the assistance of parallel modules 6, the particular value of coefficients $a_1$ through $a_N$ is digitized. Modules 6 are conventional A/D converters, for example. To represent signal $x^d(t_i)$ in the digital domain, output module 4 includes a multiplier 22 in each branch 20 for inversely transforming digitized coefficients $a_1^d$ through $a_N^d$ on the basis of orthogonal functions $g_j^d$ (for the same systems of orthogonal functions in the analog and digital domain), i.e., $h_j$ (for different systems of orthogonal functions in the analog and digital domain). The result—summands $s_1$ through $s_N$ in the digital domain—are subsequently supplied to a summation element 24 of output module 4. Signal $x_d(t_i)$ is completely representable in the digital domain through summation of the results of all parallel branches 20. In this context, the number of branches 20 corresponds to the number N of summands j.

Thus, each branch 20 includes, on the input side, correlator 8 for the transformation, module 6, also referred to as A/D converter, for the digitization, and, on the output side, multiplier 22 for the inverse transformation. All branches 20 are subsequently supplied to summation element 24. A device 1A featuring this kind of circuit-engineering design and used for analog-to-digital conversion of signal x(t) may be referred to as a correlation analog-to-digital converter. Alternatively, in place of correlator 8, matched filter 14 can also be used. In comparison to using a single A/D converter, partitioning time interval T into N segments of duration τ results in N-fold time for the conversion being available to each of the N A/D converters. This signifies a substantial reduction in the A/D converter requirements.

Figure 5:
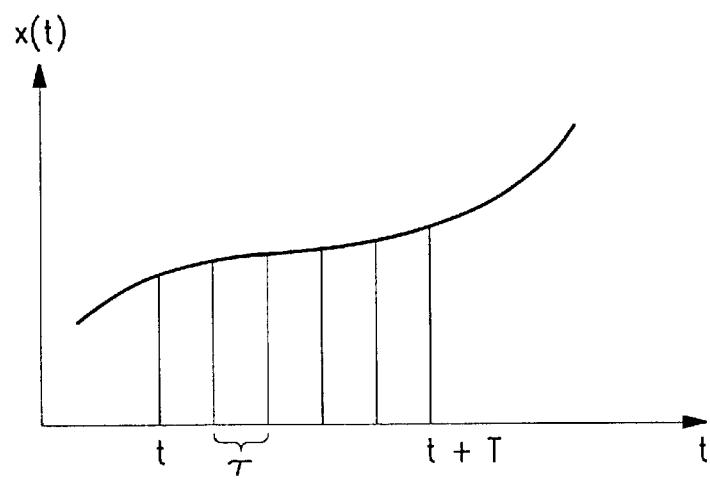
FIG. 5 shows a graphical representation of the time function of a signal.
Figure 6:
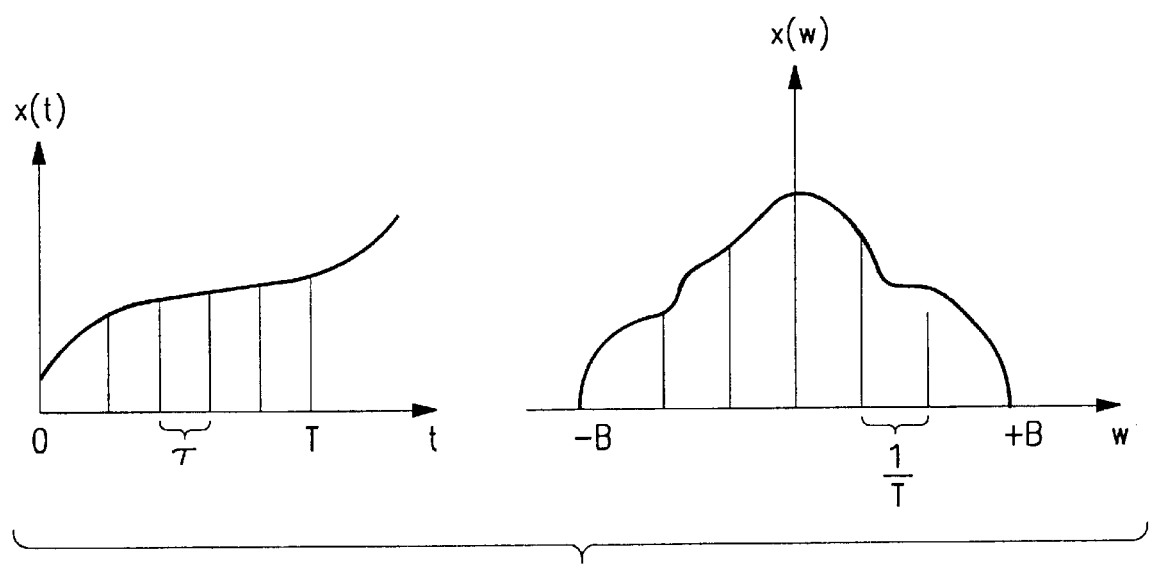
FIG. 6 shows graphical representations demonstrating the transformation of the time function of the signal in accordance with FIG. 5.

By way of example, FIG. 5 shows the time function of signal x(t), including interval T and N segments of duration τ. It holds that: T=Nτ. To attain the maximum segment length, the sampling theorem supplies a signal limited to bandwidth B: τ½B. An example of a transformation of time function x(t) into the frequency domain is shown graphically in FIG. 6.

Figure 7:
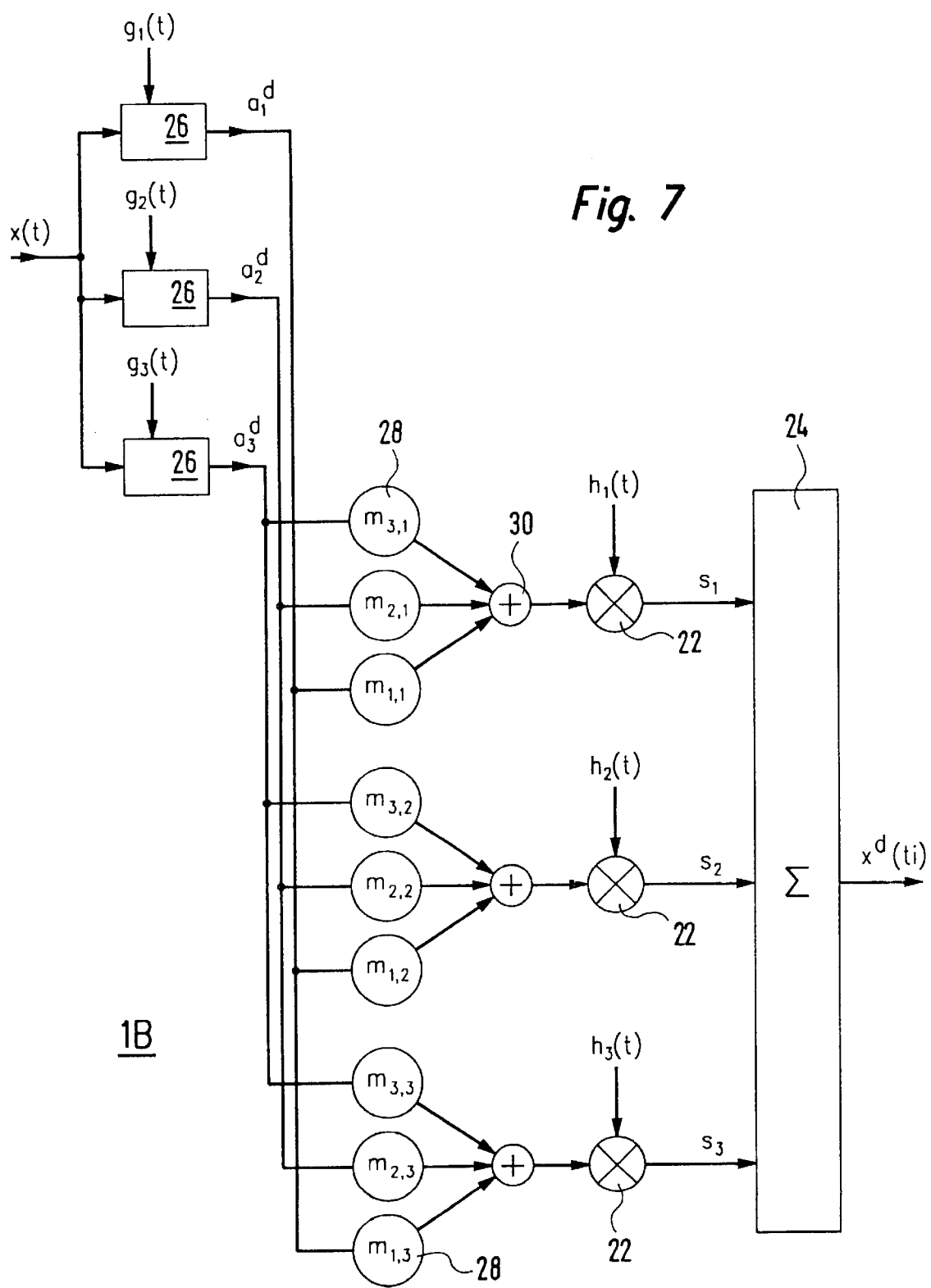
FIG. 7 shows a schematic block diagram of a device in accordance with FIG. 1, including another embodiment of an input module.

FIG. 7 illustrates an alternative embodiment according to the present invention, device 1B. The systems of orthogonal functions $g_j(t)$ in the analog domain and the systems of orthogonal functions $h_j(t)$ in the digital domain can be different. In this context, trigonometric functions are preferably employed in the analog domain as orthogonal functions $g_j(t)$. In the digital domain, Walsh or Haar functions are preferably used. The corresponding coefficients $a_j$ and $b_j$ are combined, for example, by linear transformation, as expressed by equations (5) through (9). The conversion of this process in terms of circuit engineering is shown in FIG. 7.

Device 1B is shown by way of example having N=3 channels. In N=3 modules 26, coefficients $a_1^d$, $a_2^d$, $a_3^d$ are generated from signal x(t) using orthogonal functions $g_1(t)$, $g_2(t)$, $g_3(t)$. Modules 26 are set up similarly to branches 20 in FIG. 4, however, they do not include output module 4, i.e., modules 26 include only correlator 8 and module 6 from FIG. 4. Coefficients $a_j^d$ (j=1,2,3) are multiplied by fixed numbers $m_{j,1}$ (1=1,2,3) in modules 28. Three (=N) of these multiplication results are added in summing units 30. The respective results from summing units 30 are multiplied by orthogonal functions $h_1(t)$, $h_2(t)$, $h_3(t)$ using multipliers 22. The summation of signals $s_j$ in summation element 24 yields digital output signal $x^d(t_i)$.

Figure 8:
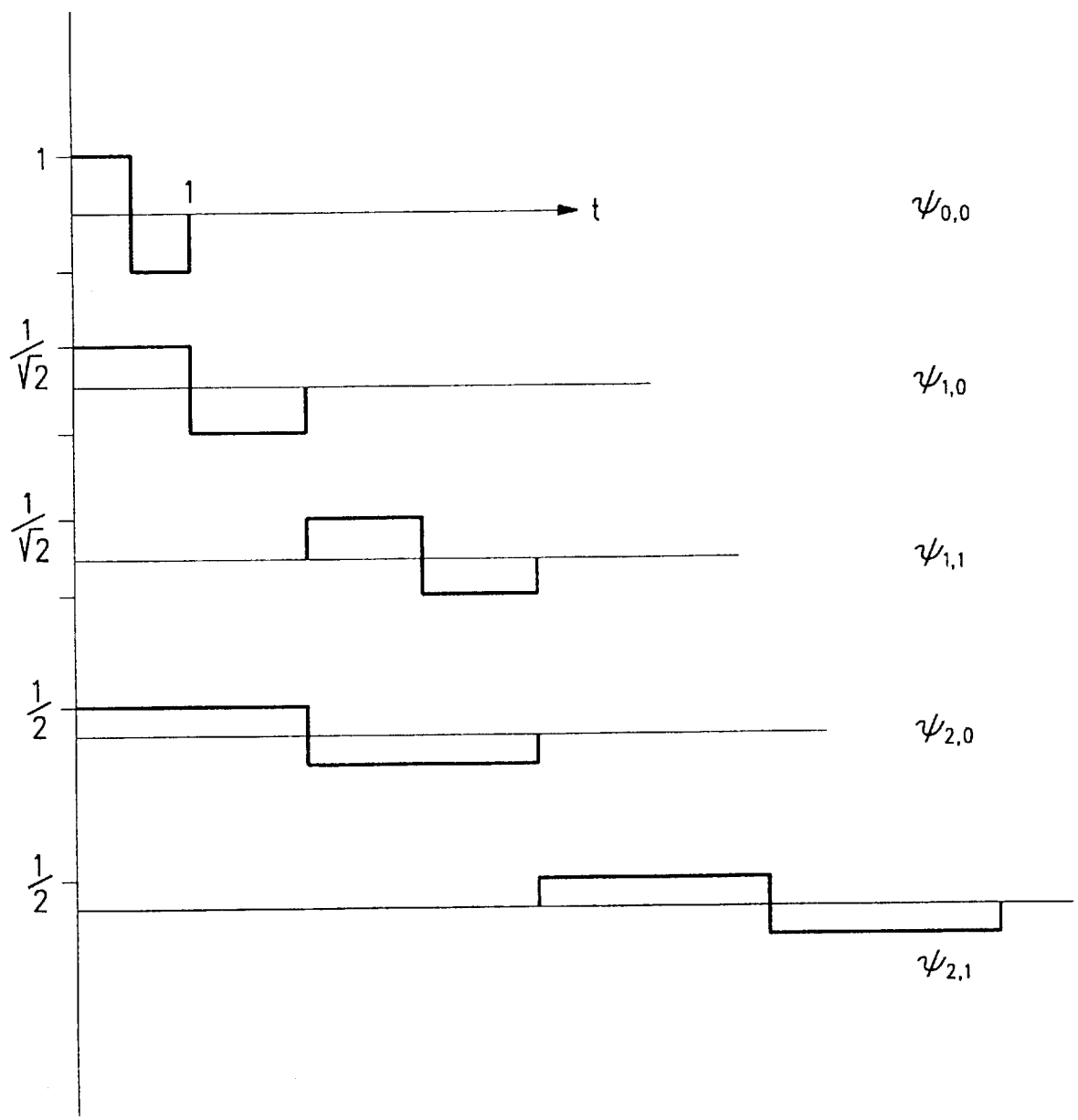
FIG. 8 shows graphical representations of various wavelet functions.

Devices 1A and 1B for the analog-to-digital conversion of signal x(t), as illustrated in FIGS. 4 and 7, are correlation analog-to-digital converters, which are based on simple correlation functions. As correlation functions, wavelet functions can optionally be used. To this end, a properly selected function, e.g., Haar function, is shifted and compressed for analysis of signal x(t). Examples of various Haar-wavelet functions (compare equations (13) and (15)) are illustrated in FIG. 8. The wavelet transformation in accordance with equation (11) is preferably used for transformation of signal x(t). The inverse transformation of signal x(t) in the digital domain is defined in equation (12). In equations (13) through (14), the transformation is shown based on the example of a Haar-wavelet function.

Figure 9:
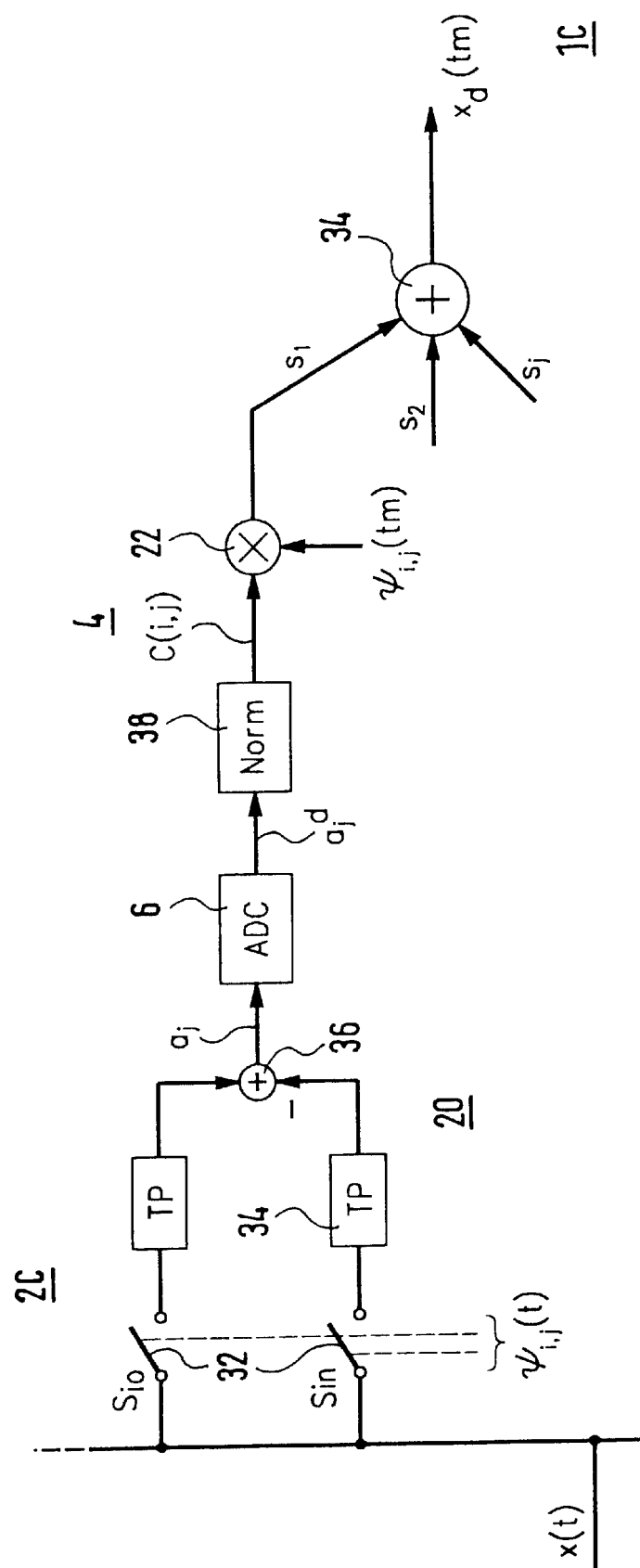
FIG. 9 shows a schematic block diagram of a device in accordance with FIG. 1, including another embodiment of an input module and of an output module.

The design in terms of circuit engineering of a device 1C based on the Haar-wavelet transformation is shown in FIG. 9. In this context, each branch 20 (here only one branch 20 is shown by way of example) includes an input module 2C for transformation of signal x(t), module 6 for digitization, as well as output module 4. The number of branches 20 is equivalent to the number N of summands j. For purposes of transformation, input module 2C includes two parallel-connected switches 32, each having an assigned low-pass filter 34. The integral of signal x(t) is formed at various instances in conformance with the corresponding Haar-wavelet function (see equation (14)) with the assistance of the function of switches 32 and of low-pass filters 34 in each branch 20. Both results of input module 2C are subsequently summed in a summing unit 36. In this context, each result of input module 2C characterizes a half wave of the corresponding Haar-wavelet function. Thus, each branch 20 processes a Haar-wavelet function, the various wavelet functions being generated by doubling or halving the width and by shifting the width by integral multiples.

Coefficient $a_j$ of the wavelet transformation is subsequently supplied for digitization to corresponding module 6. To normalize discrete coefficient $a_j^d$ as a function of the corresponding wavelet function, a matching element 38 is provided in corresponding branch 20. Thus, the normalization is carried out in the digital domain. For purposes of inverse transformation, output module 4 includes multiplier 22. The normalized coefficients c(i,j) in the digital domain determined with the assistance of the matching element are supplied to multiplier 22 for purposes of inverse transformation (see equation (12) where $c(ij)=L_{tp}x(a_i,b_i)$). Through subsequent summation of all branches 20 on the basis of summands $s_1$ through $s_N$, signal $x^d(t)$ is fully representable in the digital domain. This means that, in the case of the wavelet transformation, each branch 20 includes, on the input side, for purposes of transformation, the two switches 32, each having a corresponding low-pass filter 34; for purposes of digitization, module 6; and for purposes of inverse transformation, on the output side, matching element 38 and multiplier 22. A device 1C featuring this kind of circuit design for the analog-to-digital conversion of the signal may be designated as a wavelet analog-to-digital converter.

The various specific embodiments of devices 1, 1A, 1B and 1C described above are suited for use in a digital receiver. Other applications in the field of digital signal processing, such as in radar or radio technology, are also possible.

What is claimed is:

1. A method for analog-to-digital conversion of a band-limited signal, the method comprising:

transforming the signal using first orthogonal functions so as to define and digitize coefficients corresponding to the first orthogonal functions, the transforming being performed by limiting the signal in a time domain to at least one interval and representing the signal within each of the at least one interval by a respective sum of at least a portion of the first orthogonal functions, each sum having a predefinable respective number of summands, respective coefficients corresponding to the at least a portion of the first orthogonal functions being defined for each interval and digitized; and inversely transforming the transformed signal in a digital domain using the digitized coefficients and second orthogonal functions, the inversely transforming being performed so as to represent the signal in the digital domain.

2. The method as recited in claim 1 further comprising defining a number N of the first orthogonal functions using a sampling theorem in accordance with:

$$N=T/\tau$$

T being a length of the at least one interval in the time domain and τ being a segment in the time domain and being equal to ½B, B being a bandwidth.

3. The method as recited in claim 1 wherein the inversely transforming is performed by inversely transforming the digitized coefficients so that the signal is described in the digital domain by a multiplying of the digitized coefficients by the second orthogonal functions and by a subsequent summing.

4. The method as recited in claim 1 wherein the first and second orthogonal functions include at least one of trigonometric functions, Haar functions, Walsh functions, and complex exponential functions.

5. The method as recited in claim 1 wherein the transforming is performed by adapting discrete values of the coefficients to the first orthogonal functions and wherein the inversely transforming is performed by adapting discrete values of the digitized coefficients to the second orthogonal functions.

6. A device for analog-to-digital conversion of a band-limited signal, the device comprising:

an input module for transforming the signal in the analog domain, the input module representing the signal in an interval in a time domain by a sum of first orthogonal functions having a predefinable number of summands, the input module determining the coefficients of the transforming, the coefficients corresponding to the first orthogonal functions for the interval;

a second module for digitizing coefficients of the transforming; and an output module for inversely transforming the transformed signal in the digital domain, the output module representing the signal in the digital domain through the inversely transforming by a multiplying of the digitized coefficients by second orthogonal functions and by a subsequent summing.

7. The device as recited in claim 6 wherein each of the number of integrators includes a respective low-pass filter.

8. A device for analog-to-digital conversion of a band-limited signal, the device comprising:
- an input module for transforming the signal in the analog domain, the input module representing the signal in an interval in a time domain by a sum of first orthogonal functions having a predefinable number of summands, the input module including a number of multipliers and a number of integrators, the number of multipliers and the number of integrators being equal to the number of summands;
- a second module for digitizing coefficients of the transforming; and
- an output module for inversely transforming the transformed signal in the digital domain.

9. The device as recited in claim 8 wherein the input module represents the signal in an interval in a time domain by a sum of first orthogonal functions having a predefinable number of summands and includes a number of matched filters, the number of matched filters being equal to the number of summands.

10. The device as recited in claim 9 wherein each of the number of matched filters includes a respective sampler and a respective filter, each respective filter having a respective impulse response representing a corresponding one of the first orthogonal functions.

11. The device as recited in claim 8 wherein the input module represents the signal in an interval in a time domain by a sum of first orthogonal functions having a predefinable number of summands and wherein the input module includes a number of branches, the number of branches being equal to the number of summands, each branch including two respective parallel-connected switches, each of the two parallel-connected switches including a respective assigned low-pass filter.

12. The device as recited in claim 8 wherein the input module represents the signal in an interval in a time domain by a sum of first orthogonal functions having a predefinable number of summands and wherein the output module includes a summation element and a number of multipliers, the number of multipliers being equal to the number of summands.

13. The device as recited in claim 8 wherein the input module represents the signal in an interval in a time domain by a sum of first orthogonal functions having a predefinable number of summands and wherein the output module includes a number of matching elements, the number of matching elements being equal to the number of summands.

* * * * *